United States Patent
Sato et al.

(10) Patent No.: US 6,677,103 B2
(45) Date of Patent: Jan. 13, 2004

(54) POSITIVE-WORKING PHOTORESIST COMPOSITION

(75) Inventors: Kazufumi Sato, Sagamihara (JP); Satoshi Maemori, Sagamihara (JP); Taku Nakao, Fujisawa (JP); Kazuyuki Nitta, Ebina (JP)

(73) Assignee: Tokyo Ohka Kogyo Co., Ltd., Kanagawa-ken (JP)

(*) Notice: Subject to any disclaimer, the term of this patent is extended or adjusted under 35 U.S.C. 154(b) by 56 days.

(21) Appl. No.: 10/114,258

(22) Filed: Apr. 3, 2002

(65) Prior Publication Data

US 2002/0110750 A1 Aug. 15, 2002

Related U.S. Application Data

(62) Division of application No. 09/521,205, filed on Mar. 8, 2000, now Pat. No. 6,444,394.

(30) Foreign Application Priority Data

Mar. 18, 1999 (JP) ............................................. 11-74097

(51) Int. Cl.$^7$ .......................... G03F 7/039; G03F 7/004
(52) U.S. Cl. ................... 430/270.1; 430/170; 430/155; 430/271.1; 430/905
(58) Field of Search .............................. 430/270.1, 170, 430/155, 271.1, 905, 907, 909

(56) References Cited

U.S. PATENT DOCUMENTS

| | | | |
|---|---|---|---|
| 5,736,296 A | 4/1998 | Sato et al. | |
| 5,750,309 A | 5/1998 | Hatakeyama et al. | |
| 5,817,444 A | 10/1998 | Sato et al. | |
| 5,874,195 A | 2/1999 | Sato et al. | |
| 5,876,900 A | 3/1999 | Watanabe et al. | |
| 5,908,730 A | 6/1999 | Nitta et al. | |
| 5,945,248 A | 8/1999 | Nitta et al. | |
| 5,945,517 A | 8/1999 | Nitta et al. | |
| 5,976,759 A | 11/1999 | Urano et al. | |
| 6,136,502 A * | 10/2000 | Satoshi et al. | 430/270.1 |
| 6,284,430 B1 | 9/2001 | Oomori et al. | |
| 6,303,263 B1 | 10/2001 | Chen et al. | |

FOREIGN PATENT DOCUMENTS

| | | |
|---|---|---|
| JP | 5-232704 | 9/1993 |
| JP | 7-199468 | 8/1995 |
| JP | 9-160244 | 6/1997 |
| JP | 9-160246 | 6/1997 |
| JP | 9-179301 | 7/1997 |
| JP | 9-211868 | 8/1997 |
| JP | 9-222732 | 8/1997 |
| JP | 9-222733 | 8/1997 |
| JP | 9-236921 | 9/1997 |
| JP | 9-311452 | 12/1997 |
| JP | 10-31309 | 2/1998 |

* cited by examiner

Primary Examiner—Rosemary Ashton
Assistant Examiner—Yvette C. Thornton
(74) Attorney, Agent, or Firm—Wenderoth, Lind & Ponack, LLP

(57) ABSTRACT

Disclosed is a novel chemical-amplification positive-working photoresist composition capable of giving a patterned resist layer with excellent properties such as photosensitivity, pattern resolution, heat resistance and cross sectional profile of the patterned resist layer. The composition is characterized by the use of, as the film-forming resinous component, a hydroxyl-containing resinous ingredient which is a combination of a first resin of which from 30 to 60% of the hydroxyl groups are substituted by acid-dissociable solubility-reducing groups and a second resin of which from 5 to 20% of the hydroxyl groups are substituted by acid-dissociable groups of the same kind as in the first resin in a weight proportion of 1.9 to 9:1.

3 Claims, No Drawings

POSITIVE-WORKING PHOTORESIST COMPOSITION

This is a divisional application of Ser. No. 09/521,205, filed Mar. 8, 2000, U.S. Pat. No. 6,444,394.

BACKGROUND OF THE INVENTION

The present invention relates to a positive-working photoresist composition or, more particularly, to a positive-working chemical-amplification photoresist composition capable of being in compliance with various requirements for the performance of the photoresist relative to photosensitivity, pattern resolution, heat resistance, focusing-depth latitude, cross sectional profile of patterned resist layers, holding stability of coating layers of the composition, dependence on the nature of the substrate surface and so on as well as good reproducibility of product quality.

As compared with conventional photoresist compositions containing a naphthoquinone diazide sulfonic acid ester as the photosensitive ingredient and a novolak resin as the film-forming ingredient, photoresist compositions of the chemical-amplification type exhibit excellent photosensitivity and pattern resolution so that they are highlighted in recent years in the photolithographic technology for the manufacture of fine electronic devices. As a result of extensive investigations to accomplish improvements of the photoresist performance, a great variety of chemical-amplification photoresist compositions have been proposed, some of which are already under current use in the electronic industry.

Chemical-amplification photoresist compositions can be classified into positive-working and negative-working photoresist compositions, each of which comprises a radiation-sensitive acid-generating agent capable of releasing an acid by the irradiation with a radiation such as ultraviolet light and a film-forming resinous ingredient which is subject to a change in the solubility behavior in an aqueous alkaline solution by interacting with the acid.

In a positive-working photoresist composition of the chemical-amplification type, a typical film-forming resinous ingredient is a polyhydroxystyrene resin of which a part of the hydroxyl groups are substituted by tertiary alkoxycarbonyl groups such as tert-butoxycarbonyl groups or cyclic ether groups such as tetrahydropyranyl groups. In a negative-working photoresist composition, on the other hand, the film-forming resinous ingredient is a combination of an acid-crosslinkable compound such as a melamine resin and urea resin with a polyhydroxystyrene resin unsubstituted or substituted for a part of the hydroxyl groups as mentioned above or a novolak resin.

Various proposals and attempts have been made relative to each of the ingredients in the chemical-amplification photoresist compositions with an object to improve the performance of the photoresist layer in respect of photosensitivity, pattern resolution, heat resistance, focusing-depth latitude, cross sectional profile of patterned resist layers, holding stability of the resist layer as formed by coating, dependence on the nature of the substrate surface and other properties.

For example, a positive-working photoresist composition, in which the film-forming resinous ingredient is a combination of two resins having different kinds of the acid-dissociable substituent groups, is disclosed in Japanese Patent Kokai 8-15864, 8-262721, 9-160244, 9-179301, 9-222732, 9-222733, 10-31309 and 10-48826 and elsewhere. A proposal is made in Japanese Patent Kokai 9-160246, 9-211868, 9-274320 and 9-311452 for the use of a ternary copolymeric resin consisting of hydroxystyrene units having acid-dissociable groups of a first type, hydroxystyrene units having acid-dissociable groups of a second type and unsubstituted hydroxystyrene units in a positive-working composition. Japanese Patent Kokai 9-236921 proposes a positive-working photosensitive composition containing an alkali-soluble resin having phenolic hydroxyl groups and a weight-average molecular weight of 6000 to 60000 including 10% by weight or less of the fraction of a molecular weight smaller than 4000 and at least 80% by weight of the fraction of a molecular weight of 4000 to 70000. Japanese Patent Kokai 9-90639 proposes a positive-working composition in which the resinous ingredient is a combination of a high molecular weight polymer substituted by acid-dissociable groups having a molecular weight dispersion of 1.5 or smaller and a low molecular weight polymer substituted by acid-dissociable groups having a molecular weight dispersion of 5.0 or smaller with the proviso that the ratio of the high and low weight-average molecular weights of the resins is at least 1.5. Japanese Patent Kokai 7-199468 proposes a photosensitive composition containing a compound of low polarity of the molecules to exhibit a low dissolving velocity in alkali and another compound of high polarity of the molecules to exhibit a high dissolving velocity in alkali.

As these chemical-amplification positive-working photoresist compositions are produced and consumed in large quantities, various problems have to be solved by the producers thereof in connection with the matter of quality control in order to fully comply with the needs of the consumers.

As for the base resin as the film-forming resinous ingredient playing an important role in the photoresist composition, for example, a serious problem is in the low reproducibility in the quality of the resin products among the preparation lots even if the preparation conditions are controlled constant sometimes leading to an unacceptable product quality. Another problem recently under attention is occurrence of surface defects in the patterned resist layer after development along with the introduction of the surface-defect tester called KLA (a trade name) into the production line of the photoresist consumers.

Along with the recent trend in the semiconductor industries toward finer and finer patterning, some of the photoresist consumers request very delicate modification of the photoresist properties to comply with variations in the exposure light system, nature of the substrate surface, condition of pattern isolation and so on so that the resinous ingredients in the compositions also must comply with the respective requests of the consumers.

SUMMARY OF THE INVENTION

Under the above described technological situations, the present invention has an object to provide a chemical-amplification positive-working photoresist composition having good adaptability to the quality variation among the production lots of the base resin for the resinous film-forming ingredient thus to provide various grades of photoresist products to comply with so diversified requirements of the photoresist consumers.

Thus, the chemical-amplification positive-working photoresist composition of the present invention is a uniform solution in an organic solvent, which comprises:

(A) a polyhydroxystyrene-based resinous ingredient of which the hydroxyl groups are partly substituted by acid-dissociable substituent groups capable of being dissociated by interacting with an acid; and (B) a radiation-sensitive acid-generating compound capable of releasing an acid by irradiation with a radiation, the resinous ingredient (A) being a combination comprising (A1) a first substituted polyhydroxystyrene resin and (A2) a second substituted polyhydroxystyrene resin, the substituent groups in the first and second resins (A1) and (A2) being of the same kind, of which the degree of substitution by the substituent groups for a part of the hydroxyl groups in the first resin (A1) is larger than that in the second resin (A2) with the proviso that the ratio of the maximum weight-average molecular weight $Mw_{max}$ to the minimum weight-average molecular weight $Mw_{min}$ in each of the first and second resins (A1) and (A2), i.e. $Mw_{max}:Mw_{min}$, does not exceed 1.5.

DETAILED DESCRIPTION OF THE PREFERRED EMBODIMENTS

It is essential that, in the inventive photoresist composition, the resinous ingredient (A) is a combination of two polyhydroxystyrene resins substituted by acid-dissociable groups for a part of the hydroxyl groups in different degrees of substitution each from the other. The acid-dissociable substituent group must have an effect of insolubilizing the polyhydroxystyrene resin substituted thereby in an aqueous alkaline solution while the substituent groups are dissociated by interacting with an acid when irradiated with a radiation so as to increase the solubility of the resin in an aqueous alkaline solution.

The substituted hydroxyl group-containing resinous compound usable in the inventive photoresist composition is not particularly limitative and can be selected from those used in conventional chemical-amplification positive-working photoresist compositions without particular limitations. In order to accomplish adequate alkali solubility, adhesive bondability to the substrate surface and heat resistance, a preferable resinous compound is a polyhydroxystyrene resin of which a part of the hydroxyl groups are substituted by the acid-dissociable alkali solubility-reducing substituent groups.

Any types of known acid-dissociable substituent groups can be used in the resinous ingredient (A) in the present invention by selecting from those conventionally utilized in chemical-amplification positive-working photoresist compositions. Tertiary alkoxycarbonyl groups, tertiary alkyl groups, alkoxyalkyl groups and cyclic ether groups are preferred in consideration of their good acid-dissociability, heat resistance and cross sectional profile of the patterned resist layer.

The tertiary alkoxycarbonyl group is exemplified by tert-butyloxycarbonyl and tert-amyloxycarbonyl groups. The tertiary alkyl group is exemplified by tert-butyl and tert-amyl groups. The alkoxyalkyl group is exemplified by 1-ethoxyethyl and 1-methoxypropyl groups. The cyclic ether group is exemplified by tetrahydropyranyl and tetrahydrofuranyl groups.

Polymeric resins having hydroxystyrene units substituted for the hydroxyl group by the above named acid-dissociable substituent group include (1) a polyhydroxystyrene resin of which from 5 to 60% of the hydroxyl groups are substituted by the acid-dissociable substituent groups selected from those mentioned above and (2) a polyhydroxystyrene resin of which from 10 to 49% of the hydroxyl groups are substituted by the acid-dissociable substituent groups selected from tertiary alkoxycarbonyl groups, tertiary alkyl groups and cyclic ether groups and from 10 to 49% of the hydroxyl groups are substituted by alkoxyalkyl groups.

Examples of the combinations of polymeric compounds suitable as the component (A) in the inventive photoresist composition include (a1) a combination of a first polyhydroxystyrene resin of which from 30 to 60% of the hydroxyl groups are substituted by tert-butoxycarbonyl groups and a second polyhydroxystyrene resin of which from 5 to 20% of the hydroxyl groups are substituted by tert-butoxycarbonyl groups, (a2) a combination of a first polyhydroxystyrene resin of which from 30 to 60% of the hydroxyl groups are substituted by tetrahydropyranyl groups and a second polyhydroxystyrene resin of which from 5 to 20% of the hydroxyl groups are substituted by tetrahydropyranyl groups and (a3) a combination of a first polyhydroxystyrene resin of which from 30 to 60% of the hydroxyl groups are substituted by 1-ethoxyethyl groups and a second polyhydroxystyrene resin of which from 5 to 20% of the hydroxyl groups are substituted by 1-ethoxyethyl groups.

Other examples of suitable combinations include (a4) a combination of two copolymers each consisting of from 10 to 49% by moles of the hydroxystyrene units substituted by tert-butoxycarbonyl groups, from 10 to 49% by moles of the hydroxystyrene units substituted by 1-ethoxyethyl groups and from 2 to 80% by moles of unsubstituted hydroxystyrene units assuming that the total degrees of substitution for the hydroxyl groups are different between the two resins, (a5) a combination of two copolymers each consisting of from 10 to 49% by moles of the hydroxystyrene units substituted by tertbutyl groups, from 10 to 49% by moles of the hydroxystyrene units substituted by 1-ethoxyethyl groups and from 2 to 80% by moles of unsubstituted hydroxystyrene units assuming that the total degrees of substitution for the hydroxyl groups are different between the two resins and (a6) a combination of two copolymers each consisting of from 10 to 49% by moles of the hydroxystyrene units substituted by tetrahydropyranyl groups, from 10 to 49% by moles of the hydroxystyrene units substituted by 1-ethoxyethyl groups and from 2 to 80% by moles of unsubstituted hydroxystyrene units assuming that the total degrees of substitution for the hydroxyl groups are different between the two resins.

Each of the above described polymeric resins should have a weight-average molecular weight in the range from 2000 to 50000 or, preferably, from 5000 to 15000 and the molecular weight dispersion given by the ratio of the weight-average molecular weight Mw to the number-average molecular weight Mn, i.e. Mw:Mn, does not exceed 5.0 or, preferably, does not exceed 2.0 since the molecular weight dispersion should be as small as possible in order to accomplish improvements in the pattern resolution and heat resistance of the resist.

The resinous ingredient (A) in the inventive composition is a combination of at least two kinds of the above described polyhydroxystyrene-based resins while, in each of the constituent resins, the ratio of the maximum weight-average molecular weight $Mw_{max}$ to the minimum weight-average molecular weight $Mw_{min}$, i.e. $Mw_{max}:Mw_{min}$, should be smaller than 1.5 or, preferably, smaller than 1.3 or, more preferably, about 1.0. This limitation serves to ensure uniformity of the respective polymeric resins.

It is essential that the acid-dissociable substituent groups in one of the respective polymeric resins constituting the combination are of the same kind as those in the other constituent resins having different degrees of substitution. This limitation has an effect to ensure different velocities of dissolving in an aqueous alkaline solution so that the photoresist layer of the inventive composition can be developed with good uniformity in the light-exposed areas to suppress occurrence of surface defects.

Assuming that the resinous ingredient (A) in the inventive composition is a combination of first and second polyhydroxystyrene-based polymeric resins (A1) and (A2), in particular, the degrees of substitution for a part of the hydroxyl groups in the first and second resins are preferably in the ranges of from 30 to 60% and from 5 to 20%, respectively, or, preferably, from 35 to 60% and from 5 to 15%, respectively, since the difference in the degrees of substitution between the two polymeric resins should preferably be as large as possible in order to fully suppress occurrence of surface defects in the photoresist layer.

When the polyhydroxystyrene-based resins constituting the resinous ingredient (A) satisfy all of the above described requirements, occurrence of surface defects after development of the resist layer can be fully prevented without adversely affecting other properties such as photosensitivity, pattern resolution and cross sectional profile of the patterned resist layer.

The compounding proportion of the two kinds or more of the polyhydroxystyrene-based resins forming the combination as the resinous ingredient (A) of the inventive composition can be readily selected by making reference to the dissolving velocity of the resinous ingredient in an aqueous alkaline solution. For example, an appropriate substrate is provided with a coating layer of the component (A) and immersed in a 2.38% by weight aqueous solution of tetramethylammonium hydroxide to determine the rate of thickness reduction of the coating layer. Namely, the compounding proportion of the constituent resins is selected such that the above mentioned rate of thickness reduction does not exceed 100 nm per minute at 23° C.

When the component (A) is the above described combination (a1), for example, the mixing proportion of the two resins is selected such that the above mentioned velocity does not exceed 100 nm/minute at 23° C. by considering that the velocities of the first and second resins are 0 to 50 nm/minute and 100 to 300 nm/minute, respectively.

Similarly, the mixing proportion of the two resins in the combination (a2) is selected such that the above mentioned velocity does not exceed 100 nm/minute at 23° C. by considering that the velocities of the first and second resins are 0 to 50 nm/minute and 100 to 300 nm/minute, respectively. Further, the mixing proportion of the two resins in the combination (a3) is selected such that the above mentioned velocity does not exceed 100 nm/minute at 23° C. by considering that the velocities of the first and second resins are 0 to 50 nm/minute and 100 to 300 nm/minute, respectively.

It is usual in order to effectively prevent occurrence of surface defects in the patterned resist layer after development that the first polymeric resin and the second polymeric resin are combined in a weight proportion in the range from 1:9 to 9:1 or, preferably, from 4:6 to 1:9. In order to accomplish further improvement in the resist characteristics such as photosensitivity, pattern resolution and cross sectional profile of the patterned resist layer, it is preferable that the component (A) is a mixture of the combinations (a1) and (a3) or a mixture of the combinations (a2) and (a3).

In the positive-working photoresist composition of the invention, the acid-generating agent as the component (B), which releases an acid by the irradiation with a radiation, is not particularly limitative and can be selected from those known compounds used as an acid-generating agent in the prior art photoresist compositions of the chemical-amplification type without particular limitations. Examples of suitable acid-generating compounds include diazomethane compounds, nitrobenzyl derivatives, sulfonic acid esters, onium salts, benzoin tosylate compounds, halogen-containing triazine compounds and cyano group-containing oxime sulfonate compounds, of which diazomethane compounds and onium salts of which the anionic part is formed from a halogenoalkyl sulfonic acid having 1 to 15 carbon atoms are preferable.

The diazomethane compound is exemplified by bis(p-toluenesulfonyl) diazomethane, bis(1,1-dimethylethylsulfonyl) diazomethane, bis(cyclohexylsulfonyl) diazomethane and bis(2,4-dimethylphenylsulfonyl) diazomethane. The onium salt above mentioned is exemplified by bis(4-methoxyphenyl) iodonium trifluoromethane sulfonate, bis(p-tert-butylphenyl)iodonium trifluoromethane sulfonate, (4-methoxyphenyl)diphenylsulfonium trifluoromethane sulfonate and (p-tert-butylphenyl)diphenyl sulfonium trifluoromethane sulfonate.

The above named various acid-generating compounds can be used as the component (B) either singly or as a combination of two kinds or more according to need. The amount of the component (B) is in the range, usually, from 0.5 to 30 parts by weight or, preferably, from 1 to 10 parts by weight per 100 parts by weight of the resinous ingredient as the component (A). When the amount of the component (B) is too small, images for patterning cannot be formed while, when the amount thereof is too large, difficulties are encountered in the preparation of the composition in the form of a uniform solution suitable for coating or, even if the composition could be prepared, the solution suffers a decrease in the storage stability.

The positive-working photoresist composition of the present invention is prepared by uniformly dissolving the components (A) and (B) each in a specified amount in a suitable organic solvent. Though not particularly limitative, examples of preferable organic solvents include, in respect of the coating workability of the photoresist composition and prevention of occurrence of surface defects, propyleneglycol monoalkyl ether acetates such as propyleneglycol monomethyl ether acetate as well as mixtures thereof with lower alkyl lactates such as methyl lactate, ethyl lactate, butyl lactate and pentyl lactate or propyleneglycol mono (lower alkyl) ethers such as propyleneglycol monomethyl ether and propyleneglycol monoethyl ether.

It is optional that the positive-working photoresist composition of the invention is compounded according to need, in addition to the above described components (A) and (B), with various kinds of known additives including amine compounds to improve the holding stability of the resist coating layer or to prevent excessive diffusion of the acid generated from the component (B), carboxylic acids to improve the photosensitivity of the composition and halation-preventing agents each in a limited amount.

The procedure for the photolithographic patterning work by using the positive-working photoresist composition of the invention can be conventional. Namely, a substrate such as a semiconductor silicon wafer is coated with the photoresist composition in the form of a uniform solution on a suitable coating machine such as a spinner followed by drying to form a resist layer which is pattern-wise exposed to a radiation such as ultraviolet light, deep ultraviolet light, excimer laser beams and the like on a minifying projection light-exposure machine through a photomask bearing a desired pattern or irradiated by scanning of electron beams according to the desired pattern to form a latent image of the pattern followed by a post-exposure baking treatment. Thereafter, the latent image is developed in a development treatment by using an aqueous alkaline solution such as a 1 to 10% by weight aqueous solution of tetramethylammonium hydroxide to dissolve away the resist layer in the exposed areas leaving a patterned resist layer having fidelity to the photomask pattern.

In the following, the present invention is described in more detail by way of Examples, which, however, never limit the scope of the invention in any way, as preceded by a description of the testing procedures for the evaluation of the photoresist compositions and Reference Examples for preparation and characterization of the combination of two different resins as the component (A). In the following description, the term of "parts" always refers to "parts by weight".

(1) Photosensitivity of the photoresist composition

A silicon wafer was coated with the photoresist composition on a spinner followed by drying on a hot plate at 90° C. for 90 seconds to form a dried resist layer having a thickness of 0.7 µm. The resist layer was exposed to light on a minifying projection exposure machine (Model NSR-2005EX8A, manufactured by Nikon Co.) in step-wise increased exposure dose by an increment of 1 mJ/cm$^2$ followed by a post-exposure baking treatment at 110° C. for 90 seconds and then subjected to a development treatment at 23° C. for 60 seconds in a 2.38% by weight aqueous solution of tetramethylammonium hydroxide followed by rinse with water for 30 seconds and drying. The minimum exposure dose by which the resist layer on the substrate surface had been completely dissolved away was taken as the photosensitivity of the composition.

(2) Cross sectional profile of patterned resist layer

A line-and-space patterned resist layer of 0.25 µm line width formed in the same manner as in (1) above was examined on a scanning electron microscopic photograph for the cross section and the results were rated as A for a good orthogonal profile, B for an upwardly narrowing profile and C for a profile with a rounded top flat and trailing skirts.

(3) Pattern resolution

Resist layers were patterned in line-and-space patterns of varied line widths in the same manner as in (1) above and the critical line width was recorded as the pattern resolution.

(4) Surface defects

A resist layer patterned in the same manner as in (1) above on a 8 inch silicon wafer was examined by using a surface-defects tester (Model KLA, manufactured by KLA Co.) and the number of defects was counted on the silicon wafer and recorded.

(5) Heat resistance

A line-and-space patterned resist layer of 0.25 µm line width formed in the same manner as in (1) above was heated on a hot plate at 120° C. for 90 seconds. Thereafter, the cross sectional profile of the patterned resist layer was examined on a scanning electron microscopic photograph to record the results as A for an orthogonal profile and B for a profile showing thermal flow of the resist layer.

REFERENCE EXAMPLE 1

A solution of a base resin for the photoresist composition was prepared by dissolving, in 400 parts of propyleneglycol monomethyl ether acetate, 40 parts of a first partially substituted polyhydroxystyrene resin, of which 45% of the hydroxyl groups were substituted by tert-butoxycarbonyl groups, having a weight-average molecular weight of 10000 with a molecular weight dispersion of 1.2 and exhibiting no dissolution in a 2.38% by weight aqueous solution of tetramethylammonium hydroxide and 60 parts of a second partially substituted polyhydroxystyrene resin, of which 20% of the hydroxyl groups were substituted by tert-butoxycarbonyl groups, having a weight-average molecular weight of 10000 with a molecular weight dispersion of 1.2 and exhibiting a dissolving velocity of 150 nm/minute in a 2.38% by weight aqueous solution of tetramethylammonium hydroxide.

A coating layer formed on a silicon wafer by coating with the above prepared solution of the base resin combination followed by drying exhibited a dissolving velocity of 30 nm/minute under the same testing conditions.

REFERENCE EXAMPLE 2

A solution of a base resin for the photoresist composition was prepared by dissolving, in 400 parts of propyleneglycol monomethyl ether acetate, 30 parts of a first partially substituted polyhydroxystyrene resin, of which 50% of the hydroxyl groups were substituted by tetrahydropyranyl groups, having a weight-average molecular weight of 10000 with a molecular weight dispersion of 1.2 and exhibiting no dissolution in a 2.38% by weight aqueous solution of tetramethylammonium hydroxide and 70 parts of a second partially substituted polyhydroxystyrene resin, of which 15% of the hydroxyl groups were substituted by tetrahydropyranyl groups, having a weight-average molecular weight of 10000 with a molecular weight dispersion of 1.2 and exhibiting a dissolving velocity of 170 nm/minute in a 2.38% by weight aqueous solution of tetramethylammonium hydroxide.

A coating layer formed on a silicon wafer by coating with the above prepared solution of the base resin combination followed by drying exhibited a dissolving velocity of 20 nm/minute under the same testing conditions.

REFERENCE EXAMPLE 3

A solution of a base resin for the photoresist composition was prepared by dissolving, in 400 parts of propyleneglycol monomethyl ether acetate, 45 parts of a first partially substituted polyhydroxystyrene resin, of which 45% of the hydroxyl groups were substituted by 1-ethoxyethyl groups, having a weight-average molecular weight of 10000 with a molecular weight dispersion of 1.2 and exhibiting a dissolving velocity of 5 nm/minute in a 2.38% by weight aqueous solution of tetramethylammonium hydroxide and 55 parts of a second partially substituted polyhydroxystyrene resin, of which 25% of the hydroxyl groups were substituted by 1-ethoxyethyl groups, having a weight-average molecular weight of 10000 with a molecular weight dispersion of 1.2 and exhibiting a dissolving velocity of 130 nm/minute in a 2.38% by weight aqueous solution of tetramethylammonium hydroxide.

A coating layer formed on a silicon wafer by coating with the above prepared solution of the base resin combination followed by drying exhibited a dissolving velocity of 40 nm/minute under the same testing conditions.

REFERENCE EXAMPLE 4

A solution of a base resin for the photoresist composition was prepared by dissolving, in 400 parts of propyleneglycol monomethyl ether acetate, 45 parts of the same first partially tert-butoxycarbonyl-substituted polyhydroxystyrene resin as used in Reference Example 1 and 55 parts of a second partially substituted polyhydroxystyrene resin, of which 20% of the hydroxyl groups were substituted by tert-butoxycarbonyl groups, having a weight-average molecular weight of 5000 with a molecular weight dispersion of 1.2 and exhibiting a dissolving velocity of 160 nm/minute in a 2.38% by weight aqueous solution of tetramethylammonium hydroxide.

A coating layer formed on a silicon wafer by coating with the above prepared solution of the base resin combination followed by drying exhibited a dissolving velocity of 30 nm/minute under the same testing conditions.

REFERENCE EXAMPLE 5

A solution of a base resin for the photoresist composition was prepared by dissolving, in 400 parts of propyleneglycol monomethyl ether acetate, 35 parts of the same first partially tetrahydropyranyl-substituted polyhydroxystyrene resin as used in Reference Example 2 and 65 parts of a second partially substituted polyhydroxystyrene resin, of which 15% of the hydroxyl groups were substituted by tetrahydropyranyl groups, having a weight-average molecular weight of 5000 with a molecular weight dispersion of 1.2 and exhibiting a dissolving velocity of 180 nm/minute in a 2.38% by weight aqueous solution of tetramethylammonium hydroxide.

A coating layer formed on a silicon wafer by coating with the above prepared solution of the base resin combination followed by drying exhibited a dissolving velocity of 20 nm/minute under the same testing conditions.

REFERENCE EXAMPLE 6

A solution of a base resin for the photoresist composition was prepared by dissolving, in 400 parts of propyleneglycol monomethyl ether acetate, 50 parts of the same first partially 1-ethoxyethyl-substituted polyhydroxystyrene resin as used in Reference Example 3 and 50 parts of a second partially substituted polyhydroxystyrene resin, of which 25% of the hydroxyl groups were substituted by 1-ethoxyethyl groups, having a weight-average molecular weight of 5000 with a molecular weight dispersion of 1.2 and exhibiting a dissolving velocity of 150 nm/minute in a 2.38% by weight aqueous solution of tetramethylammonium hydroxide.

A coating layer formed on a silicon wafer by coating with the above prepared solution of the base resin combination followed by drying exhibited a dissolving velocity of 40 nm/minute under the same testing conditions.

EXAMPLE 1

A positive-working photoresist composition was prepared by dissolving, in 490 parts of propyleneglycol monomethyl ether acetate, 30 parts of the same combination of the two partially tert-butoxycarbonyl-substituted resins as in Reference Example 1, 70 parts of the same combination of the two partially 1-ethoxyethyl-substituted resins as in Reference Example 3, 7 parts of bis(cyclohexylsulfonyl) diazomethane, 0.1 part of triethylamine and 0.5 part of salicylic acid followed by filtration of the solution through a membrane filter of 0.2 μm pore diameter.

This positive-working photoresist composition was subjected to the evaluation tests of the above described testing items (1) to (5) to obtain results including:

(1) 15 mJ/cm$^2$ of the photosensitivity;
(2) grade A of the cross sectional profile of the patterned resist layer;
(3) 0.20 μm of the pattern resolution;
(4) 5 per wafer of the surface defects; and
(5) grade A of the heat resistance.

EXAMPLE 2

The formulation of the positive-working photoresist composition and the evaluation procedure thereof were substantially the same as in Example 1 excepting for the replacement of the combination of the partially tert-butoxycarbonyl-substituted polyhydroxystyrene resins with the same amount of the resin combination corresponding to Reference Example 2.

The results of the evaluation tests of this photoresist composition for the testing items (1) to (5) were as follows including:

(1) 16 mJ/cm$^2$ of the photosensitivity;
(2) grade A of the cross sectional profile of the patterned resist layer;
(3) 0.20 μm of the pattern resolution;
(4) 7 per wafer of the surface defects; and
(5) grade A of the heat resistance.

COMPARATIVE EXAMPLE 1

A positive-working photoresist compositin was prepared by dissolving, in 490 parts of propyleneglycol monomethyl ether acetate, 30 parts of the same combination of the two partially tert-butoxycarbonyl-substituted resins as in Reference Example 4, 70 parts of the same combination of the two partially 1-ethoxyethyl-substituted resins as in Reference Example 6, 7 parts of bis(cyclohexylsulfonyl) diazomethane, 0.1 part of triethylamine and 0.5 part of salicylic acid followed by filtration of the solution through a membrane filter of 0.2 μm pore diameter.

The results of the evaluation tests of this comparative photoresist composition for the testing items (1) to (5) were as follows including:

(1) 15 mJ/cm$^2$ of the photosensitivity;
(2) grade A of the cross sectional profile of the patterned resist layer;
(3) 0.20 μm of the pattern resolution;
(4) 1000 per wafer of the surface defects; and
(5) grade B of the heat resistance.

COMPARATIVE EXAMPLE 2

The formulation of the positive-working photoresist composition and the evaluation procedure thereof were substantially the same as in Comparative Example 1 excepting for the replacement of the combination of the partially tert-butoxycarbonyl-substituted polyhydroxystyrene resins with the same amount of the resin combination corresponding to Reference Example 5.

The results of the evaluation tests of this comparative photoresist composition for the testing items (1) to (5) were as follows including:

(1) 16 mJ/cm$^2$ of the photosensitivity;
(2) grade A of the cross sectional profile of the patterned resist layer;
(3) 0.20 μm of the pattern resolution;
(4) 1500 per wafer of the surface defects; and
(5) grade B of the heat resistance.

What is claimed is:

1. A chemical-amplification positive-working photoresist composition which comprises, as a uniform solution in an organic solvent:

(A) a polyhydroxystyrene-based resinous ingredient which consists of from 10 to 49% by moles of hydroxystyrene units substituted for the hydroxyl groups by substituent groups selected from the group consisting of tertiary alkoxycarbonyl groups, tertiary alkyl groups and cyclic ether groups, from 10 to 49% by moles of hydroxystyrene units substituted for the hydroxyl groups by alkoxyalkyl groups and from 2 to 80% by moles of unsubstituted hydroxystyrene units; and (B) a radiation-sensitive acid-generating compound capable of releasing an acid by irradiation with a radiation, the resinous ingredient as the component (A) being a combination comprising (A1) a first polyhydroxystyrene resin substituted for a part of the hydroxyl groups by acid-dissociable substituent groups and (A2) a second polyhydroxy-styrene resin substituted for a part of the hydroxly groups by acid-dissociable substituent groups which are the same as in the first polyhydroxystyrene resin (A1), of which the degree of substitution by the substituent groups for a part of the hydroxyl groups in the first polyhydroxystyrene resin (A) is larger than the degree of substitution in the second polyhydroxystyrene resin (A2) with the proviso that the ratio of the maximum weight-average molecular weight $Mw_{max}$ to the minimum weight-average molecular weight $Mw_{min}$ in the first and second polyhydroxystyrene resins (A1) and (A2) is smaller than 1.5.

2. The chemical-amplification positive-working photoresist composition as claimed in claim 1 in which the acid-dissociable substituent group is selected from the group consisting of tert-butoxycarbonyl group, tert-butyl group, tetrahydropyranyl group, tetrahydrofuranyl group, 1-ethoxy-ethyl group and 1-methoxypropyl group.

3. The chemical-amplification positive-working photoresist composition as claimed in claim 1 in which the polyhydroxy-styrene-based resinous ingredient as the component (A) consists of from 10 to 49% by moles of hydroxystyrene units substituted for the hydroxyl groups by substituent groups selected from the group consisting of tert-butoxycarbonyl group, tert-butyl group, tetrahydropyranyl group and tetrahydrofuranyl group, from 10 to 49% by moles of hydroxystryrene units substituted for the hydroxyl groups by 1-ethoxyethyl groups or 1-methoxypropyl groups and from 2 to 80% by moles of unsubstituted hydroxystyrene units.

* * * * *